(12) United States Patent
Mayer et al.

(10) Patent No.: US 11,408,974 B2
(45) Date of Patent: Aug. 9, 2022

(54) ELECTRONIC COMPONENT FOR EMITTING AND RECEIVING RADAR SIGNALS

(71) Applicant: Endress+Hauser SE+Co. KG, Maulburg (DE)

(72) Inventors: Winfried Mayer, Buch (DE); Martin Hitzler, Dillingen (DE)

(73) Assignee: ENDRESS+HAUSER SE+CO. KG, Maulburg (DE)

( * ) Notice: Subject to any disclaimer, the term of this patent is extended or adjusted under 35 U.S.C. 154(b) by 299 days.

(21) Appl. No.: 16/627,393

(22) PCT Filed: May 9, 2018

(86) PCT No.: PCT/EP2018/061994
§ 371 (c)(1),
(2) Date: Dec. 30, 2019

(87) PCT Pub. No.: WO2019/001817
PCT Pub. Date: Jan. 3, 2019

(65) Prior Publication Data
US 2020/0217922 A1    Jul. 9, 2020

(30) Foreign Application Priority Data
Jun. 30, 2017   (DE) ..................... 10 2017 114 686.5

(51) Int. Cl.
*G01S 7/03* (2006.01)
*G01F 23/284* (2006.01)
(Continued)

(52) U.S. Cl.
CPC ............ *G01S 7/032* (2013.01); *G01F 23/284* (2013.01); *H01Q 1/225* (2013.01); *H01Q 19/06* (2013.01);
(Continued)

(58) Field of Classification Search
CPC .......... G01S 7/032; G01S 7/028; G01S 13/88; G01S 13/08; G01F 23/284;
(Continued)

(56) References Cited

U.S. PATENT DOCUMENTS

2004/0160357 A1    8/2004  Nagasaku et al.
2005/0146469 A1    7/2005  Sampo
(Continued)

FOREIGN PATENT DOCUMENTS

DE    102015119690 A1    5/2017
WO    2008132495 A1    11/2008

*Primary Examiner* — Robert Karacsony
(74) *Attorney, Agent, or Firm* — Mark A. Logan; Endress+Hauser (USA) Holding Inc.

(57) ABSTRACT

The present disclosure relates to an electronic component for the bunched emitting and/or receiving of radar signals. For this, the electronic component comprises: a semiconductor chip, which is embodied to emit and/or to receive the radar signal by means of a primary radiator, and a support, on whose surface the semiconductor chip is arranged for electrical contacting. According to the present disclosure, the surface of the support has at least a first step embodied in such a manner that the radar signal in the case of the emitting and/or receiving is bunched approximately perpendicularly to the surface of the support. In this way, the electronic component-of the present disclosure is suited especially for those applications of radar based distance measurement, which benefit from bunched emitted and received radar signals.

11 Claims, 3 Drawing Sheets

(51) Int. Cl.
*H01Q 1/22* (2006.01)
*H01Q 19/06* (2006.01)
*G01S 7/02* (2006.01)

(52) U.S. Cl.
CPC ....... *G01S 7/028* (2021.05); *H01L 2223/6677* (2013.01)

(58) Field of Classification Search
CPC .......... H01L 23/3114; H01L 23/49503; H01L 23/4952; H01L 23/66; H01L 2223/6677; H01L 24/32; H01L 2224/04042; H01L 2224/32245; H01L 2224/48091; H01L 2224/48247; H01L 24/05; H01L 24/48; H01L 24/49; H01L 2224/48257; H01L 2224/49171; H01L 2224/73265; H01L 2924/19107; H01Q 1/225; H01Q 19/06; H01Q 1/2283; H01Q 19/005; H01Q 19/021; H01Q 9/0407
See application file for complete search history.

(56) References Cited

U.S. PATENT DOCUMENTS

| | | | |
|---|---|---|---|
| 2007/0063056 A1* | 3/2007 | Gaucher | H01L 23/5227 235/492 |
| 2009/0178478 A1* | 7/2009 | Reimelt | H01Q 19/08 73/290 V |
| 2015/0253421 A1 | 9/2015 | Matsumura et al. | |
| 2016/0240925 A1 | 8/2016 | Xue et al. | |
| 2017/0125881 A1 | 5/2017 | Mangrum et al. | |

* cited by examiner

ELECTRONIC COMPONENT FOR EMITTING AND RECEIVING RADAR SIGNALS

CROSS-REFERENCE TO RELATED APPLICATIONS

The present application is related to and claims the priority benefit of German Patent Application No. 10 2017 114 686.5, filed on Jun. 30, 2017 and International Patent Application No. PCT/EP2018/061994, filed on May 9, 2018, the entire contents of which are incorporated herein by reference.

TECHNICAL FIELD

The invention relates to an electronic component for emitting and/or receiving radar signals, as well as to a distance measuring device based thereon.

BACKGROUND

Radar based distance measurement is utilized in a broad application spectrum. Corresponding distance measuring devices are applied, for example, for position determination in air travel, for distance measurement in the case of motor vehicles or for fill level measurement in process automation of large industrial plants. For such purposes, two different radar-technologies of the state of the art can, in principle, be applied: these are, on the one hand, FMCW ("Frequency Modulated Continuous Wave", also known as continuous wave radar) and, on the other hand, the so-called pulse travel-time method. Both methods are operated within predefined radar-frequency bands (in the context of this invention, the terminology "radar signal" refers to signals, or electromagnetic waves, with frequencies between 0.03 GHz and 300 GHz).

In the field of fill level measurement, the radar-frequency bands at 6 GHz, 26 GHz and 79 GHz are used. In such case, the higher frequency bands are preferable, since there a greater absolute bandwidth can be utilized. In this way, in turn, a higher resolution is achieved. Especially in the case of fill level measurement, this is an important requirement, since, depending on application, an as exact as possible knowledge of the fill level is required. A further advantage in the case of the application of high frequencies is that the radar based distance measuring device can be equipped with a smaller antenna, without that the bunching effect of the antenna is reduced. In the case of fill level measurement, for example, smaller connection flanges for mounting on the container become possible. Therefore, it is desirable to operate fill level-, or distance measurement in general, at higher frequencies than 79 GHz (i.e at frequencies more toward 300 GHz).

Radar signals at frequencies above 100 GHz can no longer be led between the semiconductor chip, on which the radar signal is formed, and the circuit card via hybrid connection technologies. Since the dimensions of the connection structures such as bond wires or solder locations to a particular electronic component lie in the order of magnitude of the wavelength of the radar signals, these connection structures act as parasitic elements to disturb the transfer behavior. Moreover, many of the materials usual in electronics bring about losses rising with frequency, by which millimeter wave signals become significantly attenuated over short distances. The implementing of powerful and reliable millimeter wave circuits with standard technologies is for this reason more difficult with increasing frequency. This affects not least of all the resolution and the accuracy of the fill level measurement.

Therefore, monolithic semiconductor chips are applied for producing and receiving radar signals, especially above 60 GHz. Advantageous in monolithic implementation is that both the signal production unit for producing the radar signal to be emitted, as well as also the evaluating unit for distance determination based on the received radar signal, can be brought together in one semiconductor chip. In this way, it is avoided that the high-frequency radar signals must be led via external conductive traces, soldered connections or bond wires. This reduces exactly at high frequencies the disturbance susceptibility of the distance measuring device.

For emitting the radar signal and/or for receiving the reflected radar signal, the semiconductor chip includes a primary radiator. Applied in such case is, for example, a planar antenna, which is implemented as semiconductor structure of the semiconductor chip, or mounted by means of micromechanical methods on the semiconductor chip. A corresponding semiconductor chip is described, among others, in DE 10 2015 119 690 A1.

Due to the, as a rule, planar arrangement and the small dimensions of the primary radiator, the radar signal is emitted in almost the complete half space in front of the semiconductor chip. The is true also for receiving the reflected radar signal, which is received without additional bunching undirected from this half space.

At least for fill level measurement, however, at least a certain minimum amount of bunching (this is synonymous with maximum bunching angle) of the emitted radar signal and of the received radar signal is necessary. In this way, the emitted radar signal is focussed in the direction of the fill substance surface, so that the reflected radar signal is not superimposed with possible disturbance echos from the edge region of the container (thus echos, which result not from the surface of the fill substance to be detected, but, instead, from peripheral, disturbing bodies). Typically, in the case of fill level measurement, a bunching angle of maximum 35° is set. Normally, a bunching angle of 3° is tried for. In such case, the bunching angle corresponds according to the established definition to that angle, wherein, starting from the vector of the maximum power of the emitted radar signal, its power has lessened by 50%, or around −3 dB.

In order to provide such a bunching, the primary radiator, and the semiconductor chip, must be placed in front of a convex lens or parabolic reflector. Since the complete half space in front of the semiconductor chip must be covered, the aperture of the lens, or of the hollow mirror, is to be embodied correspondingly large. Connected with this, however, are considerable total reflection losses, especially in the edge region of the optics. A lessening of the total reflection losses is only possible by means of a reduction of the aperture. In such case, however, the complete half space is not covered. Thus, the radiating-, or receiving, -efficiency is reduced in both cases. This limits, in turn, the certainty, with which the distance to be determined can be detected unequivocally and faultlessly.

Exactly in the case of fill level measurement, however, a high power efficiency is required. For, although fill level measuring devices need to be embodied explosion safely and accordingly limited in power consumption, an error free fill level detection, depending on area of application, is indispensable.

SUMMARY

An object of the invention, therefore, is to provide especially for fill level measurement a safe, efficient and exact distance measuring device.

The invention achieves this object with an electronic component for emitting and/or receiving a radar signal. To this end, it includes:
- a semiconductor chip, which is embodied to emit and/or to receive the radar signal by means of a primary radiator, and
- a support with a surface, wherein the semiconductor chip is arranged for electrical contacting on the surface of the support.

According to the invention, the electronic component is characterized by features including that the surface of the support has at least a first step embodied in such a manner that the radar signal in the case of emitting and/or receiving is bunched approximately perpendicularly to the surface of the support. For this, the surface of the support is preferably embodied electrically conductively at least in the region of the first step.

By means of the electronic component of the invention, it is thus achieved that the emitted, or received, radar signal can be bunched already on the plane of the electronic component and thus very efficiently. In this way, use of later, space consuming bunching measures can be greatly reduced. In this way, the electronic component is predestined for use as a distance measuring device, and especially for fill level measurement, since, in such case, an efficient bunching contributes to an error free fill level detection For efficient bunching of the radar signal in the context of the invention, it is, moreover, advantageous that the semiconductor chip be embodied to produce the radar signal to be emitted with a frequency of greater than 100 GHz, especially greater than 150 GHz. In the case of use of the electronic component for distance measurement, the increased frequency, moreover, increases the achievable resolution.

For the purpose of a symmetric bunching of the radar signal (with reference to perpendiculars to the support surface), a suitable embodiment provides that the first step has a contour surrounding the semiconductor chip, especially a round or rectangular surrounding contour. Moreover, it has for an improved bunching proved advantageous to embody the contour of the first step at least partially corrugated or wavy. An increased bunching can, in turn, likewise be achieved by the feature that the electronic component includes a second step, which is arranged with reference to the semiconductor chip outside of the first step. Moreover, a measure for bunching is composed according to the invention by the feature that the step has a minimum distance from the primary radiator and a height, which corresponds in total to, for instance, a fourth of the wavelength of the emitted radar signal, or a whole numbered multiple thereof. By a corresponding embodiment of the first step and/or the second step in one of these embodiments, a bunching with a bunching angle of maximum 60°, especially less than 40°, can be effected for emitting and/or receiving of the radar signal.

In the context of the invention, it is not per se prescribed, whether the first step slopes downwards or upwards in the direction of the semiconductor chip. Accordingly, the first step can either form a cavity of the surface of the support, wherein the semiconductor chip is arranged, in this case, within the cavity. Or the first step forms a pedestal of the surface of the support, wherein the semiconductor chip is, in this case, arranged on the pedestal.

To the extent that the step forms neither a pedestal, nor a cavity, the support can alternatively also be so embodied that the first step forms on the surface of the support a trench structure alongside the semiconductor chip. Analogously to this, it is, furthermore, also possible that the first step alongside the semiconductor chip is constructed not as a trench, but as a wall, e.g. a surrounding wall, on the surface of the support.

For protection and for simplified external contacting of the electronic component of the invention, generally any of the established package shapes can be used. In such case, especially advantageous is to encapsulate the electronic component with a QFN package (QFN: Quad Flat No Leads Package). In such case, the support is correspondingly embodied as a lead frame. Also that region of the package, from which the beam path of the radar signal extends (thus that region above the primary radiator, which, perpendicularly to the surface of the support, or lead frame, adjoins the primary radiator), is correspondingly embodied to be transparent for the radar signal. An option for this purpose would be to provide a window in this region and/or to use a correspondingly transparent package material in this region. Instead of a QFN package, other package shapes for electronic components (e.g. DIL, SOP, SSOP, BGA) can be used as a function of the intended use of the electronic component of the invention.

The electronic component of the invention enables especially the implementing of a radar based distance measuring device for determining distance to an object. Because of the electrical component, such a distance measuring device is characterized by a bunching of the radar signal. For use as a distance measuring device, the following blocks are implemented in the semiconductor chip:
- a signal production unit, which is embodied to produce the radar signal to be emitted,
- a primary radiator embodied to emit the radar signal toward the object, and to receive the radar signal reflected on the object, and
- an evaluating unit, which is embodied to determine the distance based on the received radar signal.

By this construction in compliance with corresponding design of the electronic component of the invention, a distance measuring device can be implemented that, in given cases, can be operated without other bunching measures. In case as a function of the field of application of the distance measuring device nevertheless a more extensive bunching is needed, then a corresponding lens, hollow conductor and/or antenna can be arranged at the electronic component, in order to bunch the emitted radar signal and the received radar signal further. For this, for example, a lens can be so provided in the package of the electronic component that the lens is arranged in front of the primary radiator of the semiconductor chip in the beam path of the radar signal. Alternatively, the lens can naturally also be applied correspondingly above the package of the electronic component.

Due to the optimized bunching of the distance measuring device of the invention, it is advantageous to use the distance measuring device for determining a fill level of a fill substance located in a container. In such case, the distance measuring device is embodied and arranged at a known installed height in the container, in order to determine the fill level by means of the measured distance from the fill substance surface. Based on the electronic component of the invention, thus a safe, exact and efficient fill-level measuring device can be implemented.

BRIEF DESCRIPTION OF THE DRAWINGS

Using the figures of the appended drawing, the electronic component of the invention will now be explained in greater detail. The figures of the drawing show as follows.

DETAILED DESCRIPTION

Figure 1:
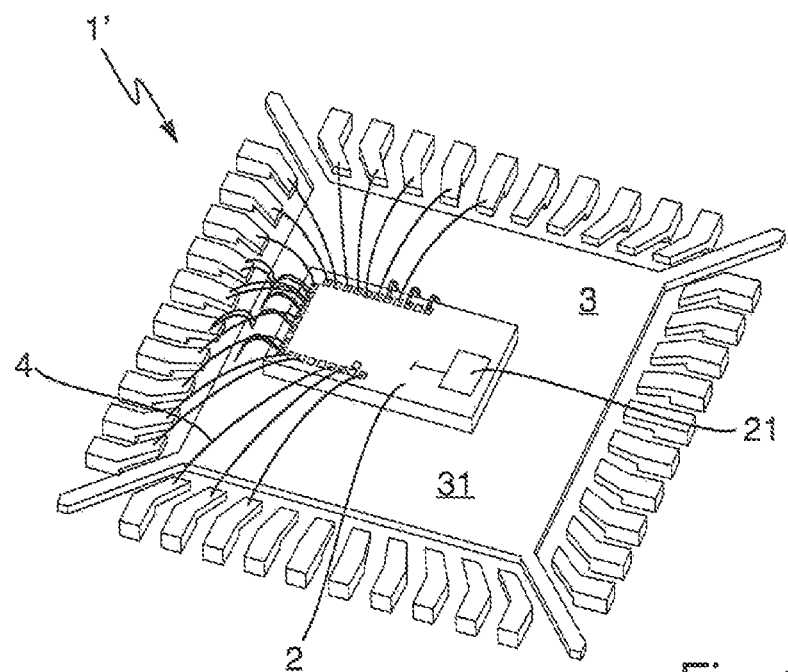
FIG. 1 shows an electronic component of the state of the art for emitting/receiving radar signals.

FIG. 1 shows an electronic component 1' of the state of the art that serves for emitting (sending) and receiving radar signals $S_{HF}$, $R_{HF}$, especially with frequencies above 100 GHz. Principal feature of the electronic component 1 is a semiconductor chip 2, which includes a primary radiator 21 on its upper surface for emitting and/or receiving radar signals $S_{HF}$, $R_{HF}$. In such case, the primary radiator 21 forms a planar antenna structure, for example, meander-shaped, which is embodied either as monolithic substructure of the semiconductor chip 2 or is placed as a hybrid structure on the semiconductor chip 2 (for example, by means of micromechanical- or other back-end method). Alternatively to the embodiment illustrated in FIG. 1, the semiconductor chip 2 can also be embodied with two primary radiators 21, each of which serves separately for sending, or receiving.

For producing the radar signal $S_{HF}$ as well as for receiving a corresponding radar signal $R_{HF}$, standard function blocks are implemented in the semiconductor chip 2 as follows:

a signal production unit, which is embodied to produce the radar signal to be emitted, the primary radiator, which emits the radar signal toward the object and receives the radar signal reflected on the object, as well as an evaluating unit, which is embodied to determine the distance based on the received radar signal.

In the case of applying the FMCW method, the signal production unit can be implemented circuit-wise, for example, as is known in the case of the FMCW method of the state of the art: by means of a voltage controlled oscillator (VCO), which is controlled via a PLL ("phase locked loop") and clocked by a clock oscillator. In such case, the voltage controlled oscillator is so controlled that on its output a signal with the "sawtooth-shaped" frequency change typical for FMCW (thus a linear change as a function of time, which periodically repeats within the frequency band) is established. This signal is fed (in given cases, via an emitting amplifier) via an emitting/receiving separator, or directional coupler, to the primary radiator 31, such that this signal is emitted as radar signal $S_{HF}$.

After reflection on the object, whose distance is to be determined, the radar signal $R_{HF}$ is received back by the primary radiator 21 as a function of travel time (and thus as a function of the distance to the object) and fed via the emitting/receiving separator, or directional coupler, to the evaluating unit. Instead of a single primary radiator 21, via which is both sent as well as also received, another option is to implement on the semiconductor chip 21 two separate primary radiators 21, one of which sends and the other receives. In such case, no emitting/receiving separator, or directional coupler, would be required.

Also the evaluating unit can be embodied in the semiconductor chip as usual for FMCW in the state of the art: fundamentally, this involves a mixer, which mixes the signal received from the emitting/receiving separator, or directional coupler, with the signal, which lies on the output of the voltage controlled oscillator of the signal production unit. The mixing leads to a so called difference signal, whose frequency changes linearly with the distance to be measured. By a corresponding measuring component for measuring this frequency, the evaluating unit can, for example, based on digital signal processing, determine the distance.

On the back side, the semiconductor chip 2 is mounted on a planar surface 31 of a support 3. Support 3 functions, in such case, as lead frame of a package of the electronic component 1'. As usual in the state of the art, the semiconductor chip 2 is mounted on the support 3, for example, by means of chip bonding or adhesive. In the illustrated example of an embodiment, the electrical contacting of the semiconductor chip 2 to corresponding contact areas of the lead frame occurs by means of bond wires 4.

Due to the planar design and the small dimensions of the primary radiator 21 in the range of maximum some hundreds of μm, its radiation lobe extends almost throughout the complete half space above the support 3. In such case, the terminology, "radiation lobe", means in the context of this invention that cone surrounded rotationally symmetrically by the bunching angle, along whose axis the radar signal $S_{HF}$ is emitted with maximum power. The bunching angle, in turn, is defined by that angle, wherein, relative to the maximum power on the axis, the emitted radar signal power has lessened to 50%, or around −3 dB. Due to the generally reciprocal properties of antennas relative to their directional effect, which acts equally in the case of sending and in the case of receiving (and thus also the reciprocal property of the primary radiator 21), this radiation lobe of the primary radiator 21 corresponds also to the directional effect in the case of the receiving of the radar signal $R_{HF}$.

Figure 2:
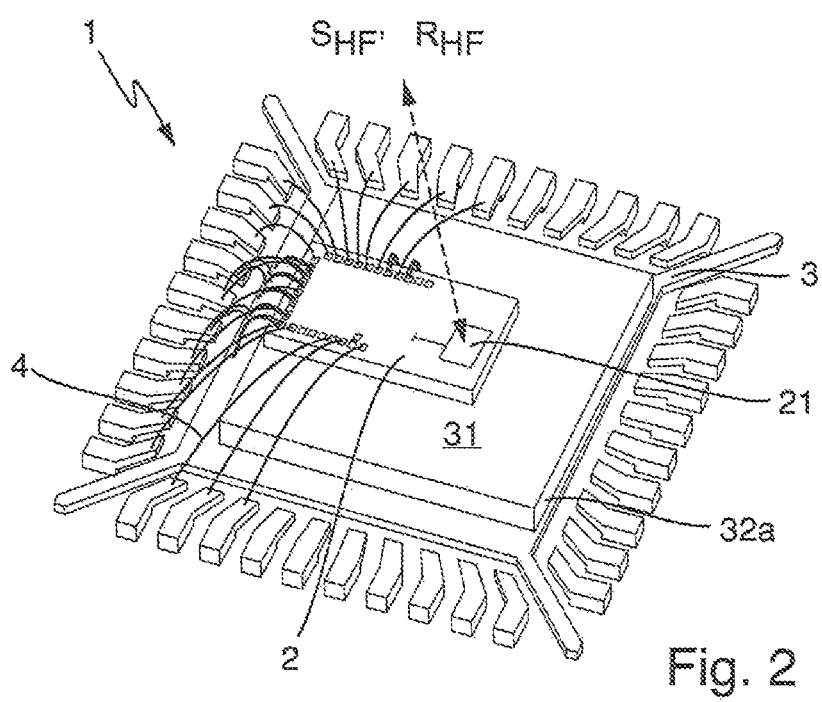
FIG. 2 shows an electronic component of the present disclosure for emitting and/or receiving radar signals.

An electronic chip 1 of the invention, which has a smaller bunching angle, and connected therewith, a narrowed radiation lobe directed, for instance, perpendicularly to the surface 31, for emitting of a radar signal $S_{HF}$ and/or for receiving a radar signal $R_{HF}$, is shown in FIG. 2 (in such case, the reciprocal arrow illustrates in FIG. 2, in turn, the axis, along which the radar signal $S_{HF}$ is emitted with the maximum power; this corresponds thus to the axis of the radiation lobe).

The narrowing of the radiation lobe, thus the bunching directed approximately perpendicularly to the surface 31, is caused according to the invention by a step 32a on the surface 31 of the support 3.

According to the invention, there are a number of possible embodiments of the step 32a. In the case of the example of an embodiment illustrated in FIG. 2, the step 32a is so embodied that it completely surrounds the semiconductor chip 2 in the form of a rectangle. Moreover, the step 32a rises toward the semiconductor chip 2. In this way, a pedestal-shaped arrangement of the semiconductor chip 2 results on the surface 31 of the support 3. As an alternative implementation of the step 32a, it would also be an option that the surface 31 is not embodied pedestal-shaped, but as a corresponding cavity, in which the semiconductor chip 2 is arranged.

The degree of bunching is influenced not only by the step 32a, but also decisively by its dimensioning. In this regard, it is preferred that the step 32a have a minimum distance to the primary radiator and a height, wherein the minimum distance and the height correspond in total, for instance, to a fourth of the wavelength of the emitted radar signal $S_{HF}$, or a whole numbered multiple thereof.

Figure 3:
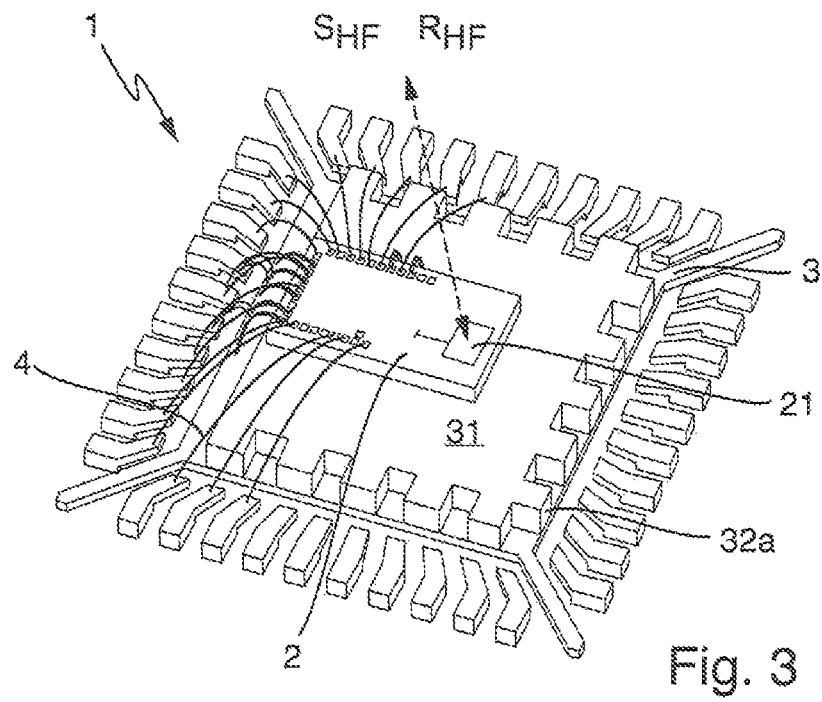
FIGS. 3 and 4 show the electronic component of the present disclosure in additional embodiments.

A second embodiment of the electronic component of the invention is shown in FIG. 3. This embodiment differs from that shown in FIG. 2 by the feature that the step 32a is not straight, but, instead, has a corrugated contour. Instead of a corrugation, the step could alternatively also be provided with a wavy contour, in order, as well as also in the case of corrugation, to achieve an increased bunching.

Figure 4:
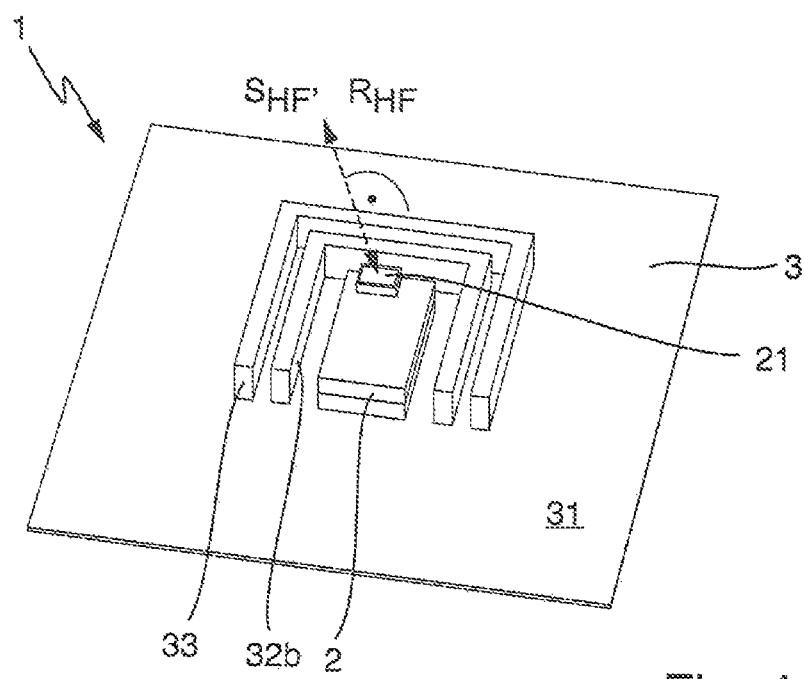

FIG. 4 represents an alternative opportunity for embodiment of a step 32b, wherein the semiconductor chip 2 is not completely surrounded by the step 32b. In such case, the step 32b is embodied as a wall, which encloses the semiconductor chip 2 on three sides (an option would naturally also be walls surrounding on one- or two sides). Analogously to surrounding walls, also a corresponding trench structure could be used for bunching.

Shown, moreover, in FIG. 4 is another measure of the invention for increasing bunching. A second step 33 is provided, which is arranged with reference to the semiconductor chip 2 outside of the first step 32b. In such case, the second step 33 is embodied as a second wall. Logically, this measure can be expanded in the form of a third, fourth, etc. step.

Figure 5:
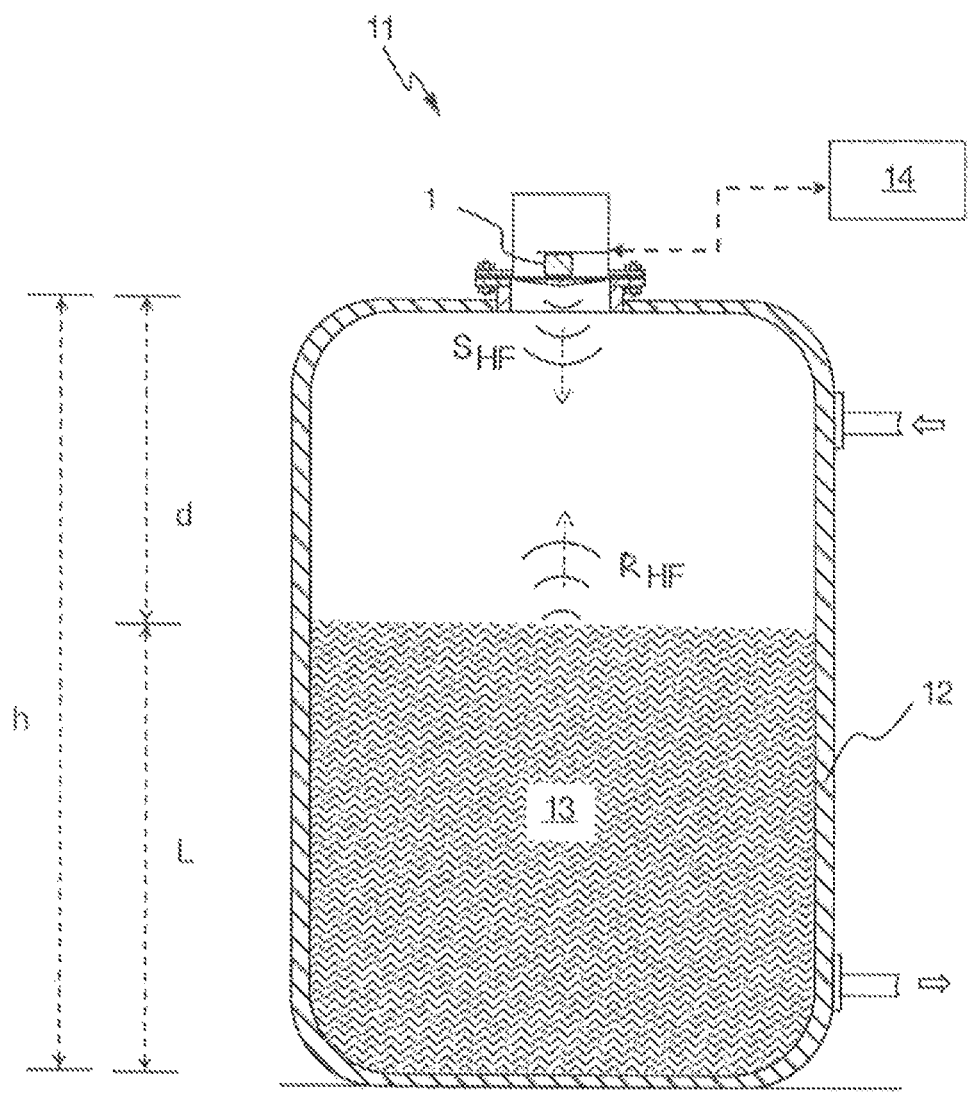
FIG. 5 shows an application of the electronic component of the present disclosure in a fill-level measuring device.

FIG. 5 shows application of the electronic component 1 of the invention in a fill-level measuring device 11. In such case, fill-level measuring device 11 serves for measuring fill level L of a fill substance 13 located in a container 12. In this regard, the fill-level measuring device 11 is placed at a previously known installed height h above the floor of the container 12. Depending on process plant, such a container 12 can rise to heights of greater than 30 m.

The fill-level measuring device 11 is so embodied on the container 2 that the electronic component 1 emits the radar signal $S_{HF}$ in the direction of the surface of the fill substance 13. After reflection on the fill substance surface, the fill-level measuring device 11, and the electronic component 1, receives the reflected radar signal $R_{HF}$ as a function of the distance d=h−L to the fill substance surface. Since the installed height h is known, the fill level L can be determined by means of the above formula based on the measured distance d. In the case of implementing the pulse-travel time method, the distance d is calculated based on the measured travel time t of the emitted, pulse shaped radar signal $S_{HF}$. In the case of the FMCW method, the distance d is ascertained via the instantaneous frequency difference between the emitted, frequency-modulated radar signal $S_{HF}$ and the received, reflected radar signal $R_{HF}$.

As a rule, the fill-level measuring device 11 is connected via a bus system, for instance, a "PROFIBUS", "HART" or "wireless HART" bus system, with a superordinated unit 14, for example, a process control system. In this way, on the one hand, information concerning the operating state of the fill level measuring device 11 can be communicated. Also information concerning the fill level L can be transferred, in order, in given cases, to control the inflow or outflow of the container. By equipping the fill level measuring device 11 with the electronic component 1 of the invention, both the emitted radar signal $S_{HF}$ as well as also the received radar signal $R_{HF}$ can be bunched, so that, in given cases, no additional measures for bunching need be provided for the fill-level measuring device 11. In the case of corresponding design, the bunching achieves that the emitted radar signal $S_{HF}$ is reflected only on the surface of the fill substance 13. In this way, possible installed objects away from the radiation lobe surrounded by the bunching angle do not lead to disturbing reflections. Moreover, the fill-level measuring device 11 can by the increased bunching be operated power optimized, whereby, among other things, the achieving of explosion protection measures is simplified (in the European region, the standard EN 600/79 is effective for fill level measuring devices as regards explosion protection).

The invention claimed is:

1. An electronic component for emitting and/or receiving a radar signal, comprising:
   a semiconductor chip embodied to emit and/or to receive the radar signal by means of a primary radiator; and
   a support having a surface, wherein the semiconductor chip is arranged for electrical contacting on the surface of the support, and wherein the surface of the support has a first step embodied such that the radar signal in the case of the emitting and/or receiving is bunched approximately perpendicularly to the surface of the support,
   wherein the first step forms a cavity of the surface of the support and the semiconductor chip is arranged within the cavity.

2. The electronic component as claimed in claim 1, wherein the semiconductor chip is embodied to produce the radar signal to be emitted with a frequency of greater than 100 GHz.

3. The electronic component as claimed in claim 1, wherein for bunching the radar signal, the surface of the support is electrically conductive at least in the region of the first step.

4. The electronic component as claimed in claim 1, wherein the electronic component further has a second step which is arranged with reference to the semiconductor chip outside of the first step.

5. The electronic component as claimed in claim 2, wherein the first step is disposed a minimum distance from the primary radiator, and wherein the first step has a height that corresponds to a fourth of the wavelength of the emitted radar signal or a whole numbered multiple of a fourth of the wavelength of the emitted radar signal.

6. The electronic component as claimed in claim 1, wherein the electronic component is encapsulated with a package, and wherein the support is embodied as a lead frame.

7. The electronic component as claimed in claim 4, wherein the first step and/or the second step are/is embodied in such a manner that a bunching with a bunching angle of maximum 60° can be effected for emitting and/or receiving of the radar signal.

8. A radar-based distance measuring device for determining a distance to an object, comprising:
   an electronic component for emitting and/or receiving a radar signal, the electronic component including:
      a semiconductor chip embodied to emit and/or to receive the radar signal, wherein the semiconductor chip includes:
         a signal production unit embodied to produce a radar signal to be emitted;
         a primary radiator embodied to emit the radar signal toward the object and to receive a radar signal reflected on the object; and
         an evaluating unit embodied to determine the distance based on the received radar signal; and
      a support with a surface,
      wherein the semiconductor chip is arranged for electrical contacting on the surface of the support, and wherein the surface of the support has a first step embodied such that the radar signal in the case of the emitting and/or receiving is bunched approximately perpendicularly to the surface of the support, and
      wherein the first step forms a cavity of the surface of the support and the semiconductor chip is arranged within the cavity.

9. The radar-based distance measuring device as claimed in claim 8, wherein a lens, a hollow conductor, and/or an antenna are/is arranged at the electronic component, in order to bunch the emitted radar signal and the received radar signal further.

10. A method of determining a fill level of a fill substance in a container, comprising:
  providing a radar-based distance measuring device for determining a distance to an object, comprising:
    an electronic component for emitting and/or receiving a radar signal, the electronic component including:
      a semiconductor chip embodied to emit and/or to receive the radar signal, wherein the semiconductor chip includes:
        a signal production unit embodied to produce a radar signal to be emitted;
        a primary radiator embodied to emit the radar signal toward the object and to receive a radar signal reflected on the object; and
        an evaluating unit embodied to determine the distance based on the received radar signal; and
      a support with a surface,
      wherein the semiconductor chip is arranged for electrical contacting on the surface of the support, and wherein the surface of the support has a first step embodied such that the radar signal in the case of the emitting and/or receiving is bunched approximately perpendicularly to the surface of the support, and
    wherein the first step forms a cavity of the surface of the support and the semiconductor chip is arranged within the cavity;
  arranging the distance measuring device at a known installed height in the container;
  emitting the radar signal in the direction of the surface of the fill substance;
  receiving a reflected radar signal after reflection on the fill substance surface;
  measuring a distance from the distance measuring device to the fill substance surface; and
  determining the fill level by means of the measured distance.

11. An electronic component for emitting and/or receiving a radar signal, comprising:
  a semiconductor chip embodied to emit and/or to receive the radar signal by means of a primary radiator; and
  a support having a surface, wherein the semiconductor chip is arranged for electrical contacting on the surface of the support, and wherein the surface of the support has a first step embodied such that the radar signal in the case of the emitting and/or receiving is bunched approximately perpendicularly to the surface of the support,
  wherein the first step has a round or rectangular contour surrounding the semiconductor chip and the contour of the first step is embodied at least partially corrugated or wavy.

\* \* \* \* \*